United States Patent
Suzuki et al.

(10) Patent No.: US 7,468,528 B2
(45) Date of Patent: Dec. 23, 2008

(54) SEMICONDUCTOR LIGHT-EMITTING DEVICE

(75) Inventors: Jun Suzuki, Kanagawa (JP); Masato Doi, Kanagawa (JP); Hiroyuki Okuyama, Kanagawa (JP); Goshi Biwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 75 days.

(21) Appl. No.: 11/329,589

(22) Filed: Jan. 10, 2006

(65) Prior Publication Data

US 2006/0169997 A1 Aug. 3, 2006

(30) Foreign Application Priority Data

Jan. 13, 2005 (JP) .............................. 2005-006704

(51) Int. Cl.
*H01L 33/00* (2006.01)
(52) U.S. Cl. .............................. 257/79; 257/13; 257/80; 257/100; 257/101; 257/103; 257/918; 257/E51.018; 257/E51.022; 257/E33.001; 257/E33.054; 257/E25.032
(58) Field of Classification Search ................... 257/13, 257/79–103, 918
See application file for complete search history.

(56) References Cited

U.S. PATENT DOCUMENTS

| 6,936,864 B2 * | 8/2005 | Kondo ......................... 257/103 |
| 2005/0189551 A1 * | 9/2005 | Peng et al. .................... 257/94 |
| 2005/0264172 A1 * | 12/2005 | Wojnarowski et al. ....... 313/498 |

FOREIGN PATENT DOCUMENTS

| JP | 7153993 | 6/1995 |
| JP | 2004111493 | 4/2004 |

\* cited by examiner

*Primary Examiner*—Wai-Sing Louie
*Assistant Examiner*—Marc Armand
(74) *Attorney, Agent, or Firm*—Bell, Boyd & Lloyd

(57) ABSTRACT

A semiconductor light-emitting device is provided. The semiconductor light-emitting device includes a laminated semiconductor structure portion composed of at least a first conductivity type first cladding layer, an active layer and a second conductivity type second cladding layer, wherein an outer peripheral surface of this laminated semiconductor structure portion is formed as a curved surface shape which is protrusively curved or bent with respect to the outside of the laminated direction.

7 Claims, 4 Drawing Sheets

|  | θ1 | θ2 | θ3 |
|---|---|---|---|
| Inventive Example 1 (Structure 1) | 45° | 50° | 50° |
| Inventive Example 2 (Structure 2) | 45° | 50° | 55° |
| Inventive Example 3 (Structure 3) | 45° | 50° | 60° |
| Inventive Example 4 (Structure 4) | 45° | 50° | 70° |
| Inventive Example 5 (Structure 5) | 45° | 50° | 80° |

SEMICONDUCTOR LIGHT-EMITTING DEVICE

CROSS REFERENCE TO RELATED APPLICATIONS

The present application claims priority to Japanese Patent Application JP 2005-006704 filed in the Japanese Patent Office on Jan. 13, 2005, the entire contents of which being incorporated herein by reference.

BACKGROUND

The present invention generally relates to a semiconductor light-emitting device, for example, a GaN-based light-emitting diode (LED).

It is generally desired that a semiconductor light-emitting device, for example, a light-emitting diode (LED) should emit light at a luminous efficiency as high as possible and that light should be emitted to the outside at high light emission efficiency.

Research and development has been conducted in order to improve this light emission efficiency, see, Official Gazette of Japanese laid-open patent application No. 7-153993 and Official Gazette of Japanese laid-open patent application No. 2004-111493. That is, in these semiconductor light-emitting diodes, the end face of an active layer is inclined so that the light emitting direction can be set by forming the shape of the light-emitting diode (LED) chip, that is, the peripheral surface of the LED chip as an inclined surface which is curved in a dented fashion or by forming the shape of the LED chip as a stair-like shape in which the thickness of the chip is decreased substantially. Also, light emission efficiency can be increased by avoiding reflection of light within the light-emitting diode or decay of light can be decreased by decreasing the number of reflections of light within the light-emitting diode to thereby improve light emission efficiency.

SUMMARY

In view of the aspects described above, a semiconductor light-emitting device is provided that is capable of surface-emitting light from a specific light emitting surface with higher light emission efficiency at higher light density by a structure different from that of the related-art semiconductor light-emitting devices, for example, a structure based on an idea different from the above-mentioned related-art structures.

In accordance with an embodiment, there is provided a semiconductor light-emitting device which is comprised of a laminated semiconductor structure portion including a first cladding layer of a first conductivity, an active layer and a second cladding layer of a second conductivity type, wherein an outer peripheral surface of the laminated semiconductor structure portion is shaped like a curved surface protrusively curved or bent toward the outside with respect to the laminated direction thereof.

In the semiconductor light-emitting device according to an embodiment of the present invention, the first cladding layer has a major surface formed as a light emitting surface of the semiconductor light-emitting device, the curved surface being shaped such that its angle of inclination relative to the light emitting surface of a tangent of each portion with respect to the laminated direction ranges of from about 45° to about 55°.

Moreover, in the semiconductor light-emitting device according to an embodiment, the curved surface is curved or bent in such a manner that the angle of inclination of the tangent is increased as it approaches the light emitting surface side.

Furthermore, in the semiconductor light-emitting device according to an embodiment, the second conductivity side opposite to the light emitting surface of the semiconductor light-emitting device has a major surface on which an electrode is formed, the electrode being formed of a metal electrode having high reflectance relative to light from the semiconductor light-emitting portion.

As described above, according to an embodiment of the semiconductor light-emitting device, since the shape of the outer peripheral surface of the laminated semiconductor structure portion including at least the first conductivity type first cladding layer, the active layer and the second conductivity type second cladding layer, that is, the light emitting function portion is formed as the curved surface shape which is protrusively curved or bent toward the outside with respect to the laminated direction, the major surface of the side of one cladding layer is used as the light emitting surface and the semiconductor light-emitting device is able to surface-emit light from this light emitting surface with high light emission efficiency.

Because the outer peripheral surface shape is formed as the curved surface shape which is protrusively curved or bent toward the outside, a probability that light directly propagated to this peripheral surface from the active layer through the laminated semiconductor structure portion and light reached this peripheral surface after being reflected on the major surface opposite to the light emitting surface, for example, will be reflected on this curved surface in a total reflection fashion can be increased so that light can travel toward the target light emitting surface. Therefore, light emission efficiency of light emitted from the light emitting surface can be improved and light density at which light is introduced from the original target light emitting surface can be increased as compared with the case in which light is emitted from the peripheral surface or the like to the outside.

Moreover, since the inclination of the tangential line of the curved surface shape is selected in a range of from about 45° to about 55° at least in a part and also since the curved surface is curved or bent in such a manner that the inclination of the tangential line is increased as it approaches the light emitting surface, light reaching the peripheral surface near the light emitting surface can be reflected efficiently in a total reflection fashion and hence light can be emitted from the original light emitting surface with high light emission efficiency at high light density.

Furthermore, since the electrode of the second conductivity side of the semiconductor light-emitting device relative to the major surface of the opposite side of the light emitting surface is composed of the metal electrode with high reflectance, the light emission efficiency with which light is emitted from the light emitting surface can be further increased.

DETAILED DESCRIPTION

A semiconductor light-emitting device according to embodiments of the present invention will now be described with reference to the drawings. While the present invention is applied to a nitride semiconductor light-emitting diode (LED) having a high light emission efficiency of short-wavelength of green or ultraviolet rays, for example, an InGaN-based light-emitting diode by way of example, it should be appreciated that the present invention is not limited to those illustrated inventive examples.

Figure 1:
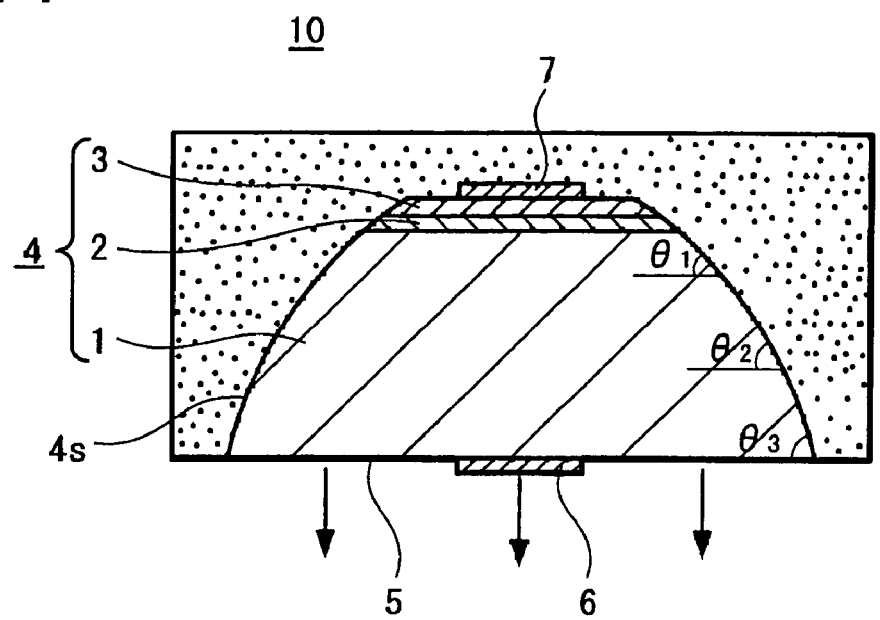
FIG. 1 is a schematic cross-sectional view showing a semiconductor light-emitting device according to an embodiment of the present invention.
Figure 2:
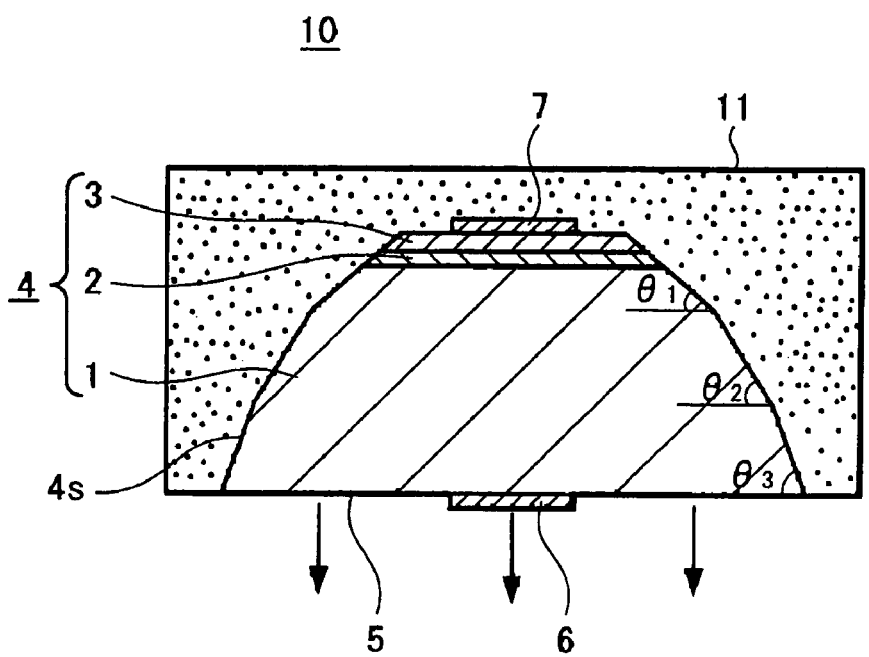
FIG. 2 is a schematic cross-sectional view showing a semiconductor light-emitting device according to another embodiment of the present invention.

FIGS. 1 and 2 of the accompanying drawings are respectively schematic cross-sectional views showing an example of the above-mentioned InGaN-based light-emitting diode 10. As shown in FIGS. 1 and 2, this light-emitting diode 10 includes a laminated semiconductor structure portion 4 in which an In GaN active layer 2 having a thickness of, for example, 150 nm and a second conductivity type, for example, p type second cladding layer 3 having a thickness ranging of from 100 nm to 380 nm are laminated on a first conductivity type, for example, n type GaN first cladding layer 1 having a thickness of, for example, 3 µm to 3.5 µm, and its plane pattern has a suitable shape such as square or circle.

In this embodiment, this semiconductor light-emitting diode 10 has a surface-emission arrangement in which it has a light emitting surface 5 formed on the laminated semiconductor structure portion 4 at its major surface on the first cladding layer 1 side.

A first electrode 6, for example, n type electrode is brought in contact with this light emitting surface 5 and a second electrode 7, for example, p type electrode is brought in contact with the major surface of the second cladding layer 3 side of the opposite side opposing this light emitting surface 5.

The first electrode 6 on the side of the light emitting surface 5 can be constructed as a transparent electrode or a mesh electrode or formed on a part of the light emitting surface 5 so that light can be effectively emitted from the light emitting surface 5.

Also, the second electrode 7 may have an arrangement of an electrode such as an Ag electrode with high reflectance relative to a wavelength of emitted light.

In an embodiment of the present invention, the outer peripheral surface 4s of the laminated semiconductor structure portion 4 constructing mainly the light-emitting function portion is formed as a curved shape which is protrusively curved or bent with respect to the laminated direction, that is, to the outside.

This curved shape may be shaped which does not depend on a single radius of curvature with respect to the above-mentioned laminated direction so that this curved shape can be formed as a curved surface as shown in FIG. 1 or it can be composed of a plurality of bent surfaces as shown in FIG. 2.

Then, this outer peripheral surface 4s may be formed in such a manner that its angle of inclination, that is, an angle between a tangential line and the light emitting surface 5 may become large, that is, steep as it approaches the light emitting surface 5. For example, as shown in FIGS. 1 and 2, angles $\theta_1$, $\theta_2$ and $\theta_3$ which approach the light emitting surface 5 from the opposite side of the light emitting surface 5 are selected so as to satisfy $\theta_1 < \theta_2 < \theta_3$.

Further, it is desirable that an angle of at least a part of this outer peripheral surface 4s, that is, the angle $\theta_2$ of the intermediate portion is selected in a range of from about 45° to about 55°, more preferably, this outer peripheral surface 4s is formed as the curved surface of which angle lies in a range of from 45° to 55°.

This light-emitting diode (LED) 10 is covered with a package 11 made of a suitable resin such as a resin manufactured by Nippon Steel Chemical Co., Ltd., under the trade name of "VPA" and a polyimide-based resin.

As described above, according to the arrangement of one embodiment of the present invention, when the outer peripheral surface 4s is formed as the curved surface in which the angle $\theta_2$ of at least a part of the intermediate portion falls within a range of from 45° to 55°, more preferably, within a range of from 48° to 49°, it is possible to improve the light emission efficiency. The reason for this is that light from the major surface of the side of the second cladding layer 3, light based on reflection from the second electrode 7 and light traveling from the active layer 2 to the outer peripheral surface 4s may effectively travel toward the light emitting surface owing to reflection and total reflection so that repetitive reflection and a stray optical path can be avoided effectively.

Figure 3:
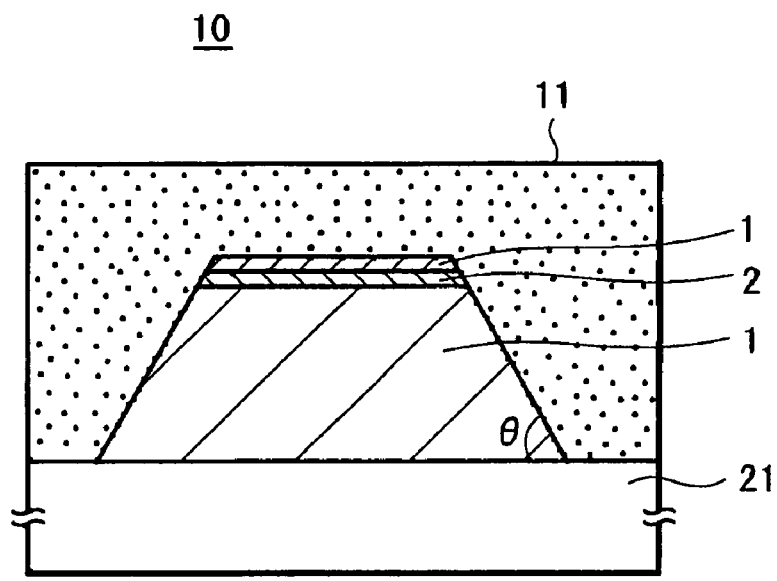
FIG. 3 is a schematic cross-sectional view of a target semiconductor light-emitting device and to which reference will be made in explaining light emission efficiency.

Moreover, one reason that this light emission efficiency can be improved is described below. As shown in a schematic cross-sectional view of FIG. 3, although the laminated semiconductor structure formed of the first cladding layer 1, the active layer 2 and the second cladding layer 3 is formed on a sapphire substrate 21 similarly to FIGS. 1 and 2, the above reason is considered on the assumption that its outer peripheral shape is a shape having a single inclination angle θ. In this case, the surface of the semiconductor light-emitting diode 10 is formed as the package 11 covered with the above-mentioned resin "VPA".

Figure 4:
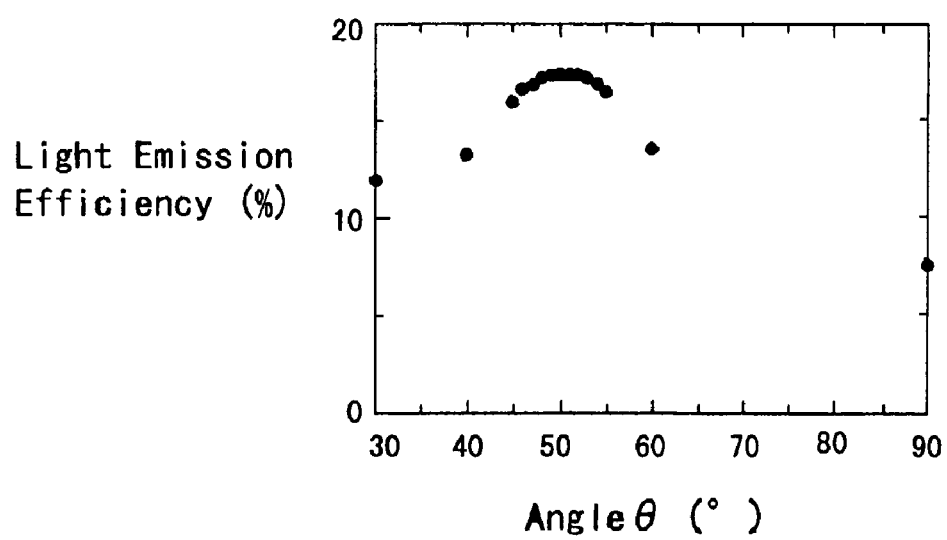
FIG. 4 is a diagram showing a relationship between an inclination of a device outer peripheral portion and light emission efficiency according to an embodiment of the present invention.

According to this arrangement, when the light emission efficiency from the sapphire substrate 21 side was measured while the angle θ was being changed, there are obtained measured results shown in FIG. 4.

As is clear from the measured results of FIG. 4, when the angle θ is selected in a range of from 45° to 55°, high light emission efficiency can be obtained. When the angle θ is selected in a range of from 48° to 49°, the light emission efficiency demonstrates its peak value. Thus, according to an embodiment of the present invention, it is to be understood that high light emission efficiency can be obtained by properly selecting the angle of inclination.

Figures 5, 6:
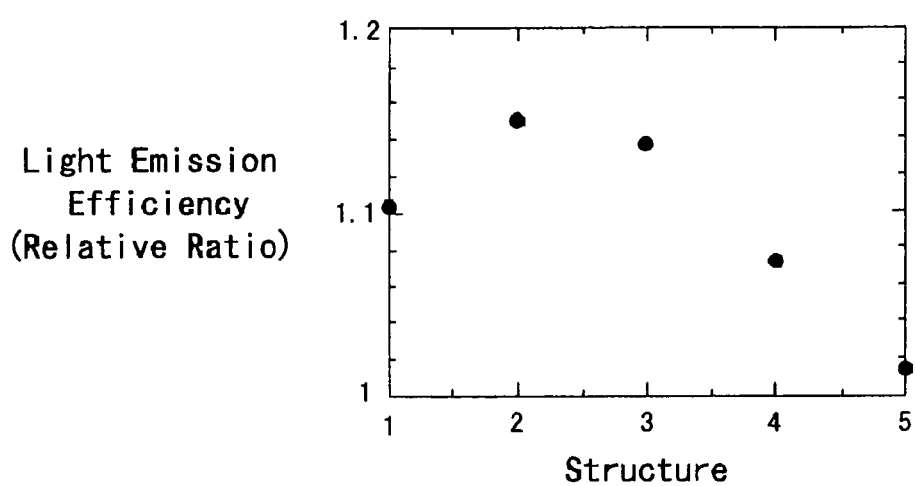
FIG. 5 is a table showing angles of inclination of respective portions of structures 1 to 5 of inventive examples 1 to 5 of the semiconductor light-emitting devices according to an embodiment of the present invention.
FIG. 6 is a diagram showing a relative ratio between a semiconductor light-emitting device with a single angle of inclination of light emission efficiency of the light-emitting devices with the respective structures 1 to 5 shown in FIG. 5 and light emission efficiency.

Next, an embodiment of the present invention will be described with reference to inventive examples using the structures 1 to 5 as shown in the table of FIG. 5.

INVENTIVE EXAMPLE 1

In the aforementioned arrangement shown in FIG. 2, the angle $\theta_1$ was selected to be 45°, the angle $\theta_2$ was selected to be 50° and the angle $\theta_3$ was selected to be 50° and thus we have prepared the structure 1.

INVENTIVE EXAMPLE 2

In the aforementioned arrangement shown in FIG. 2, the angle $\theta_1$ was selected to be 45°, the angle $\theta_2$ was selected to be 50° and the angle $\theta_3$ was selected to be 55° and thus we have prepared the structure 2.

INVENTIVE EXAMPLE 3

In the aforementioned arrangement shown in FIG. 2, the angle $\theta_1$ was selected to be 45°, the angle $\theta_2$ was selected to be 50° and the angle $\theta_3$ was selected to be 60° and thus we have prepared the structure 3.

INVENTIVE EXAMPLE 4

In the aforementioned arrangement shown in FIG. 2, the angle $\theta_1$ was selected to be 45°, the angle $\theta_2$ was selected to be 50° and the angle $\theta_3$ was selected to be 70° and thus we have prepared the structure 4.

INVENTIVE EXAMPLE 5

In the aforementioned arrangement shown in FIG. 2, the angle $\theta_1$ was selected to be 45°, the angle $\theta_2$ was selected to be 50° and the angle $\theta_3$ was selected to be 80° and thus we have prepared the structure 5.

FIG. 6 is a diagram showing measured results of light emission efficiency of these structures 1 to 5. In FIG. 6, the horizontal axis represents the structures 1 to 5 and the vertical axis represents ratios of light emission efficiency of the structures 1 to 5 relative to the light emission efficiency obtained when the angle is selected to be the single angle of inclination of 45°.

From the measured results shown in FIG. 6, it is to be understood that when the light emitting surface is formed as the curved surface having the angle selected in a range of from 45° to 65° and which is protrusively curved toward the outside, excellent light emission efficiency can be obtained as compared with the case in which the angle is selected to be at least the single angle of inclination of 45°.

A method of manufacturing a semiconductor light-emitting device according to an embodiment of the present invention will be described with reference to process diagrams of FIGS. 7A to 7E.

This example shows the case in which the light-emitting diode (LED) 10 shown in FIG. 1 is manufactured.

Figure 7A:
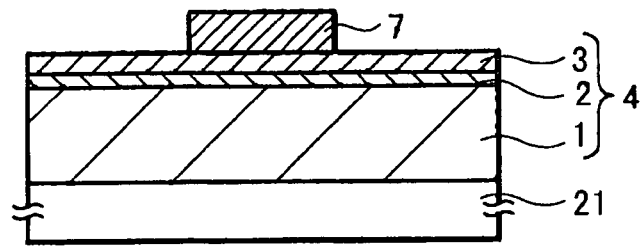
FIGS. 7A to 7E are respectively process diagrams showing a method of manufacturing a semiconductor light-emitting device according to an embodiment of the present invention.

First, as shown in FIG. 7A, a first conductivity type, for example, n type GaN first cladding layer 1, an InGaN active layer 2 and a second conductivity type, for example, p type GaN second cladding layer 3 are epitaxially deposited on a substrate 21, for example, a sapphire substrate by an MOCVD (metal organic chemical vapor deposition) method, thereby a laminated semiconductor structure portion 4 being constructed.

Then, a second electrode 7 having an AgPtAuNi or NiPtAuNi structure, for example, with a predetermined pattern, that is, a circular pattern with a diameter less than 50 μm, for example, 14 μm is temporarily formed on the whole surface of the second cladding layer 3 by a suitable method such as vapor deposition and sputtering and then the resultant second electrode 7 is further processed by pattern etching based on photolithography.

Figure 7B:
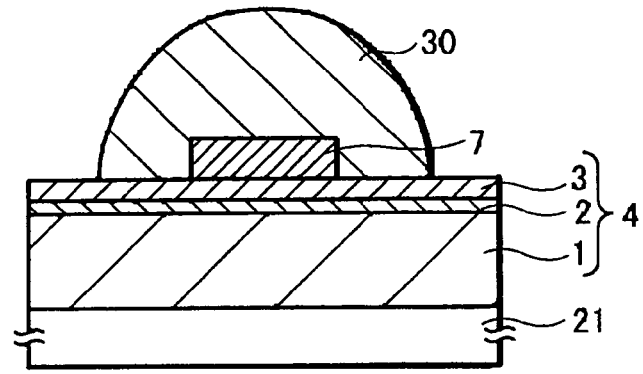

Then, as shown in FIG. 7B, a resist layer which becomes a dry etching mask 30 having a predetermined diameter is formed so as to cover the second electrode 7, whereafter this resist layer is heated and formed as a shape having a predetermined curved surface by reflow. The shape of the resist layer can be selected by properly selecting the aspect ratio of the resist and reflow conditions.

Figure 7C:
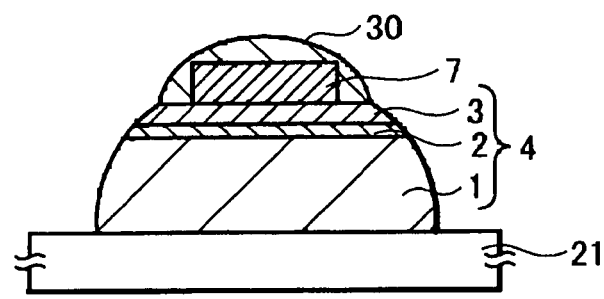

Then, as shown in FIG. 7C, the resultant product is treated over the dry etching mask 30 by dry-etching using $Cl_2$, for example. According to this treatment, an outer peripheral surface 4s of the laminated semiconductor layer 4 can be formed as the predetermined shape following the surface shape of the dry etching mask 30, that is, the aforementioned curved surface shape.

Figure 7D:
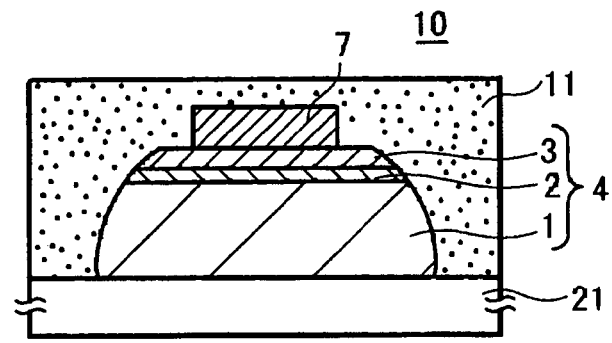

Thereafter, as shown in FIG. 7D, a package 11 is deposited on the semiconductor light emitting diode 10 by the aforementioned resin.

Figure 7E:
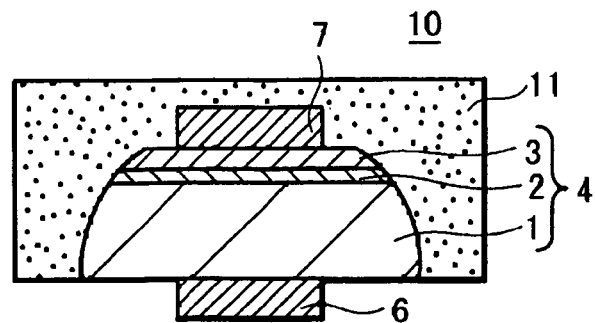

Then, as shown in FIG. 7E, by laser abrasion based on laser irradiation from the sapphire substrate 21, the sapphire substrate 21 is removed from the semiconductor light emitting diode 10 and the major surface on the side of the first cladding layer 1 is exposed to the outside by this removal, thereby a first electrode 6 being formed.

In this manner, there can be obtained the semiconductor light emitting device according the present invention shown in FIG. 1, in this example, a GaN light emitting diode (LED) 10.

Then, when the semiconductor light-emitting device having the outer peripheral surface 4s of the curved shape having a plurality of different angles of inclination in the example shown in FIG. 2, for example, is formed, such semiconductor light-emitting device can be manufactured by repeating a plurality of dry etchings with the masks having predetermined inclined surfaces as the dry etching mask 30.

As described above, light can be emitted from the predetermined light emitting surface, that is, the major surface of the side of the first cladding layer 1, for example, by using the GaAs light-emitting semiconductor device which shows high luminous efficiency. Also, the semiconductor light-emitting device according to the present invention is able to emit light at high light density with high light emission efficiency.

Further, while the semiconductor light-emitting device is composed of the first cladding layer, the active layer and the second cladding layer in the above-described embodiments, the present invention is not limited thereto and can be variously changed and modified.

As described above, according to the semiconductor light-emitting device of the present invention, since the shape of the outer peripheral surface of the laminated semiconductor structure portion including at least the first conductivity type first cladding layer, the active layer and the second conductivity type second cladding layer, that is, the light emitting function portion is formed as the curved surface shape which is protrusively curved or bent toward the outside with respect to the laminated direction, the major surface of the side of one cladding layer is used as the light emitting surface and the semiconductor light-emitting device is able to surface-emit light from this light emitting surface with high light emission efficiency.

The reason for this is described below. That is, since the outer peripheral surface shape is formed as the curved surface shape which is protrusively curved or bent toward the outside, a probability that light directly propagated to this peripheral surface from the active layer through the laminated semiconductor structure portion and light reached this peripheral surface after being reflected on the major surface opposite to the light emitting surface, for example, will be reflected on this curved surface in a total reflection fashion can be increased so that light can travel toward the target light emitting surface. Therefore, light emission efficiency of light emitted from the light emitting surface can be improved and light density at which light is introduced from the original target light emitting surface can be increased as compared with the case in which light is emitted from the peripheral surface or the like to the outside.

Further, since the inclination of the tangential line of the curved surface shape is selected in a range of from 45° to 55° at least in a part and also since the curved surface is curved or bent!in such a manner that the inclination of the tangential line is increased as it approaches the light emitting surface, light reached the peripheral surface near the light emitting surface can be reflected efficiently in a total reflection fashion and hence light can be emitted from the original light emitting surface with high light emission efficiency at high light density.

Furthermore, since the electrode of the second conductivity side of the semiconductor light-emitting device relative to the major surface of the opposite side of the light emitting surface is composed of the metal electrode with high reflectance, the light emission efficiency with which light is emitted from the light emitting surface can be increased more.

It should be understood by those skilled in the art that various modifications, combinations, sub-combinations and alterations may occur depending on design requirements and other factors insofar as they are within the scope of the appended claims or the equivalents thereof.

The invention is claimed as follows:

1. A semiconductor light-emitting device comprising:
   a laminated semiconductor structure portion including a first cladding layer of a first conductivity type, an active layer and a second cladding layer of a second conductivity type, wherein an outer peripheral surface of said laminated semiconductor structure portion is shaped as a curved surface protrusively curved or bent toward an outside with respect to the laminated direction thereof, wherein the laminated semiconductor structure portion further includes a first electrode formed on a major surface of the second cladding layer and a second electrode directly formed on a major surface of the first cladding layer, wherein said first cladding layer has the major surface formed as a light emitting surface of said semiconductor light-emitting device, and wherein said curved surface is shaped such that angles of inclination of tangents to said curved surface relative to said light emitting surface range from about 45° to about 55°.

2. The semiconductor light-emitting device according to claim 1, wherein said curved surface is curved or bent in such a manner that angles of inclination of tangents of said curved surface increase as they approach said light emitting surface side.

3. The semiconductor light-emitting device according to claim 1, wherein said second conductivity side opposite to said light emitting surface has a major surface on which an electrode is formed, said electrode being formed of a metal having a high reflectance of light emitted from said semiconductor light-emitting portion.

4. A semiconductor light-emitting device comprising:
   a laminated semiconductor structure portion including a first cladding layer of a first conductivity type, an active layer and a second cladding layer of a second conductivity type, wherein an outer peripheral surface of said laminated semiconductor structure portion is shaped as a curved surface protrusively curved or bent toward an outside with respect to the laminated direction thereof, wherein the laminated semiconductor structure portion further includes a first electrode formed on a major surface of the second cladding layer and a second electrode directly formed on a major surface of the first cladding layer, wherein said first cladding layer has the major surface formed as a light emitting surface of said semiconductor light-emitting device, and said second conductivity side opposite to said light emitting surface has a major surface on which an electrode is formed, said electrode being formed of a metal having a high reflectance of light emitted from said semiconductor light-emitting portion.

5. The semiconductor light-emitting device according to claim 4, wherein said first cladding layer has the major surface formed as a light emitting surface of said semiconductor light-emitting device, and wherein said curved surface is shaped such that angles of inclination of tangents to said curved surface relative to said light emitting surface range from about 45° to about 55°.

6. The semiconductor light-emitting device according to claim 4, wherein said curved surface is curved or bent in such a manner that angles of inclination of tangents of said curved surface increase as they approach said light emitting surface side.

7. The semiconductor light-emitting device according to claim 5, wherein said curved surface is curved or bent in such a manner that angles of inclination of tangents of said curved surface increase as they approach said light emitting surface side.

* * * * *